United States Patent [19]
Brehler et al.

[11] Patent Number: 5,581,899
[45] Date of Patent: Dec. 10, 1996

[54] PROCESS FOR COMPENSATING A MAGNETIC INTERFERENCE FIELD IN A VEHICLE

[75] Inventors: Markus Brehler, Baierbrunn; Patrick Feigen, München, both of Germany

[73] Assignee: Siemens Aktiengesellschaft, Munich, Germany

[21] Appl. No.: 211,103

[22] PCT Filed: Aug. 27, 1992

[86] PCT No.: PCT/EP92/01981

§ 371 Date: Mar. 15, 1994

§ 102(e) Date: Mar. 15, 1994

[87] PCT Pub. No.: WO93/06434

PCT Pub. Date: Apr. 1, 1993

[30] Foreign Application Priority Data

Sep. 17, 1991 [DE] Germany .......................... 91115776.6

[51] Int. Cl.$^6$ ......................................... G01C 17/38
[52] U.S. Cl. .................. 33/356; 33/361; 364/559
[58] Field of Search ......................... 73/1 E; 33/356, 33/357, 361, 363 Q; 364/559, 571.05

[56] References Cited

U.S. PATENT DOCUMENTS

| | | | |
|---|---|---|---|
| 4,414,753 | 11/1983 | Moulin et al. ............... | 33/356 |
| 4,622,843 | 11/1986 | Hormel . | |
| 4,738,031 | 4/1988 | Alberter et al. ............ | 33/356 |
| 4,751,783 | 6/1988 | Ina et al. .................... | 33/361 |
| 4,797,841 | 1/1989 | Hatch ......................... | 33/356 |
| 4,807,462 | 2/1989 | Al-Attar . | |

FOREIGN PATENT DOCUMENTS

| | | |
|---|---|---|
| 0382290 | 8/1990 | European Pat. Off. . |
| 0451839 | 10/1991 | European Pat. Off. . |
| 3644681 | 7/1988 | Germany . |
| 4000345 | 7/1990 | Germany . |

Primary Examiner—Thomas B. Will
Attorney, Agent, or Firm—Hill, Steadman & Simpson

[57] ABSTRACT

Process for compensating a magnetic interference field in a vehicle having a navigation installation. During a calibration run for initial compensation, a first set of interference field parameters is determined from the measurements of the magnetic field probe (interference field vector V1, axes a, b of the elliptical locus curve E1, oblique position) and transformed onto points of a circular locus curve with the radius a about the origin (0); the distance from the origin (0) and the angle are calculated for each pair of measurements. The calculated radius values and the circularly transformed pairs of measurements (MP) are averaged and entered in their appropriate memory cell in a segmented memory for 360° with a plurality of memory cells (predetermined angular region). Variant 1: for each segment, the radius difference (Δa) is determined from the averaged radius values and the radius (a) and filtered; from this the maximum (MAX) is calculated according to direction and magnitude and the new center (M2) of the locus curve (K2) and thus the new interference field vector (V2=V1+V2') are calculated. The distances from the measurement points (MP) are calculated from M2 and compared with the radius; if there is adequately accurate agreement, compensation is carried out with the new interference field vector (V2). Variant 2: a straight line (g) is calculated from the averaged X and Y values by means of linear regression. Their correlation coefficient is determined and compared with an empirically found threshold; if the correlation coefficient is greater than the threshold, the center point (P) of the straight line section (S1,S2) is determined, which is given by the pairs of measurement points (MP). The perpendicular (L) at the center point (P), towards the origin (0), is constructed and the circle radius (a) is plotted, the end point of the radius forming the center (M2) of the new locus curve (circle K2) (new interference field vector V2).

16 Claims, 1 Drawing Sheet

PROCESS FOR COMPENSATING A MAGNETIC INTERFERENCE FIELD IN A VEHICLE

BACKGROUND OF THE INVENTION

The invention relates to a process for compensating for a magnetic interference field in a vehicle.

In order to direct the route of a vehicle, it is necessary to determine the direction of the earth's magnetic field in relation to the vehicle. The magnetic field is measured by a magnetometer, e.g. a magnetic field probe, which is fixedly mounted in the vehicle. During a calibration run, e.g. a circular run, the parameters of the locus curve, namely of an ellipse, of the magnetic field are determined in accordance with a known process. The parameters of the elliptical locus curve are the two semiaxes a and b, their rotation through a specified angle δ which describes the shape, and the displacement from the coordinate origin. This displacement is designated the "interference field vector".

An analysis of the accumulated measurement data of the magnetic field probe has revealed that the interference field vector changes in a discontinuous manner on account of external influences, while the shape of the locus curve as a rule remains constant. Such influences are, by way of example, the movement of a steel sliding roof or of a glass sliding roof with a steel frame, changing slopes of the roadway which extend perpendicular to the direction of travel, the loading or unloading of metallic loads in the vehicle or the switching of an electrical load in the vehicle, such as for example the rear window heating. These changes are longer-lasting or take place slowly, for example in the range of minutes. They must be distinguished from short-term interference or interference fields, which are caused by subways or buses traveling past.

Accordingly, various compensation processes have already been described. By way of example, German reference DE-OS 36 44 681 discloses a navigation process for vehicles having an electrical compass, in which strong magnetic influences in the environment of the magnetic field sensor are compensated for using a dynamic drag process. In the known process, a weighted interference field vector is added to the interference vector. In this process, it is however disadvantageous that the distinction between short and longer-lasting interference fields takes place only exclusively with the aid of the weighting factor. If the weighting factor according to the known process is selected to be 0.1 with a cycle time of 100 msec, then much short term interference, as mentioned above, is fully involved in the interference vector displacement and thus corrupts the result of the navigation in a lasting fashion. If, on the other hand, the weighting factor is selected to be so small that the above effect does not occur, then the short term interference fields are nevertheless involved in the result, but more weakly. Moreover, the drag then lasts for a very long time, for example in the ten-minute range, so that navigation is subjected to interference for an unreasonably great length of time.

SUMMARY OF THE INVENTION

Accordingly, the object of the invention is to improve a process for compensating for magnetic interference fields which are generated by discontinuous changes and lead to longer-lasting interference. In this case, short-term interference which likewise leads to a change in the measured magnetic field can be suppressed, in order thereby to avoid indication errors.

The process according to the invention has the following process steps:

The locus curve of the measurements of the magnetic field probe lies on an ellipse. During a calibration run, for initial compensation, the interference field parameters (parameters of this ellipse) are determined, that is to say the center coordinates, the axes a and b and the oblique position. All measurements are transformed onto a circle with the radius a and the coordinate origin. All further process steps take place in this transformed system. Short-term interference field changes are detected using filters and by confidence region checks, and the associated magnetic field probe measurements are separated out. The angle and radius are calculated for each pair of measurements. The radius is stored in a segmented memory in accordance with the associated angle. This segmented memory covers the entire angular range from 0° to 360°; a multiplicity of angular ranges, for example 15° in each instance, being formed, with associated memory cells. All radii which have been stored in identical memory cells of the segmented memory are averaged. In addition, the averages of all pairs of measurements belonging to an angular range are formed and stored. As soon as a sufficient quantity of measurements is available and a specified number of angular ranges has been swept over, one of the two processes described below is carried out.

In a first variant, the radius difference is calculated from the averaged radius value and the radius value of the original circle for each angular range. The radius difference values are filtered by means of a low pass filter, and the maximum of the magnitude is then determined. A new center of the locus curve is obtained by displacement of the old center by the magnitude and associated direction of the previously determined maximum. In a further step, the distances from the new circle center to the stored mean measurement values are calculated and compared with the radius of the original circle from the initial compensation, the newly determined interference field vector being declared valid if there is adequately accurate agreement. If there is no adequately accurate agreement, then the segment which corresponds to the maximum is declared invalid and the procedure is repeated using the remaining segments. This takes place as often as is necessary until either a fitting value has been found or a maximum percentage of all segment regions employed has been used up.

In another variant of the compensation process according to the invention, a straight line is calculated from the averaged measurements (X,Y) by means of linear regression, and its correlation coefficient is compared with an empirically determined value. If the correlation coefficient is greater, then the center of gravity of all the pairs of measurements is determined, e.g. as an average, the point of intersection of the straight line with the circle. The perpendicular at this center towards the coordinate origin is constructed. The radius of the circle is now plotted on the perpendicular, the end point giving the center of the new locus curve, so that the further compensation can be carried out with the interference field vector obtained thereby.

In both processes, measurements are first assembled and processed during a specific period of time, before the actual procedure of compensation matching is carried out. If detectable interference occurs during this phase, the measurement collection phase is interrupted and recommenced.

In both processes, the instant of the compensation process is determined by the following criteria:

A specified number of measurements have been received and a specified number of angle segments have been described.

In an improvement of the process, different combinations of a specific number of measurements and angle segments are permitted, at least one of which must be satisfied. The reason for this resides in the following fact:

A vehicle travels for a relatively long time substantially straight ahead, and a large number of measurements are collected within a small angular range. In another case, a vehicle travels through a 90° curve, a small number of measurements being entered in a relatively large number of angular ranges. In both cases, empirical recompensation should be possible.

In a development of the process according to the invention, even during the data collection phase a check is made as to how well the present interference field vector corresponds to the instantaneous measurements. In this case, the radii of the measurements are compared with the theoretical radius. If a relatively great deviation is established, then the new measurements can be buffer-stored and, after the next compensation matching, the position can be corrected retroactively.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
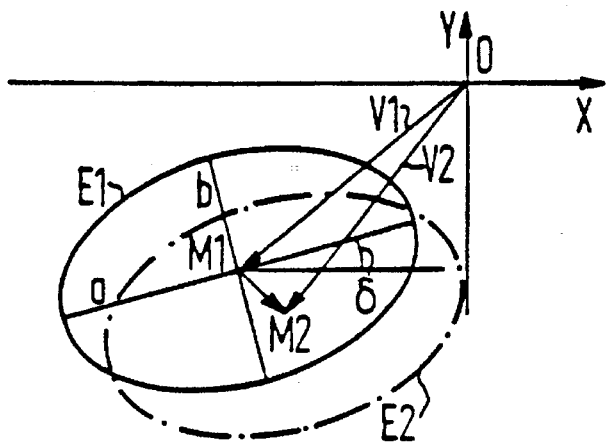
FIG. 1 shows an elliptical locus curve of the magnetic field and its displacement in a cartesian coordinate system.

The known calibration procedure is illustrated in FIG. 1. During a calibration run, the parameters of the locus curve—ellipse E1—of the magnetic field are determined and stored.

Accordingly, this locus curve is known together with its parameters, the semiaxes a, b and the angular rotation δ and displaced from the coordinate origin O on account of the interference field, so that the interference field vector V1 can be calculated from the coordinate origin O to the center M1 of the ellipse E1. A discontinuous change of the magnetic field again leads to a further displacement of the elliptical locus curve; this is indicated in FIG. 1 by the broken-line ellipse E2, which then exhibits the center M2. The object of the invention is now to determine the discontinuous change of the interference field and thus the new interference field vector V2.

Figure 2:
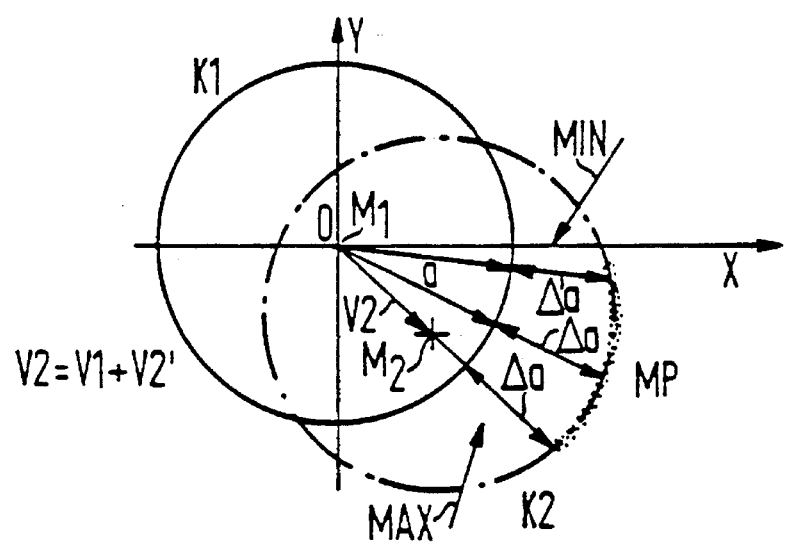
FIG. 2 shows a displaced locus curve, transformed onto the circle, on the basis of the interference field for calculation by means of maximum and pattern recognition.

The process according to the invention (variant 1) for determining the interference field vector is intended to be illustrated with reference to FIG. 2. As initially explained, the measurements which fall within a specified segment are averaged with their radius value. The circle K1 corresponds to the locus curve from the initial compensation with the radius a and the center M1 at the origin O, which was determined using the calibration run. In the event of the vehicle continuing to move, and in the event of a discontinuous magnetic field change being caused, e.g. by opening the steel sliding roof, a new locus curve K2 is obtained with a series of measurement points MP, which were caused by this discontinuous interference. According to the invention, the radius difference value Δa is now calculated, for each segment, from the averaged radius values and the radius a of the original circle K1. In order to exclude scattered values of the measurement points, the radius difference values are filtered by means of a low pass filter. The maximum MAX is now determined, in terms of magnitude and direction, from the filtered radius difference values, and the center M2 of the new locus curve K2 is calculated therefrom. The new interference field vector V2 (from FIG. 1) with which the further compensation is intended to be carried out is now calculated therefrom.

Before, however, compensation takes place with this new interference field vector V2, pattern recognition is also started. To this end, the distances of the stored measurement points MP, transformed onto the circle K2, from the new circle center M2 are initially calculated. In this case, these distances are intended to agree adequately accurately with the radius a of the circle K1 from the initial compensation. If this condition is satisfied, then the operation finally takes place with the new interference field vector V2. Otherwise, the calculated maximum is designated as unusable and a new maximum is sought. The entire procedure is repeated until either a usable maximum has been found or more than a specific number of described angular segments have been identified as unusable. The process according to the invention has the advantage that in the event of a discontinuous disturbance of the magnetic field occurring, discontinuous rapid matching to the new magnetic interference field vector takes place. Subsequent matching by means of a directional factor is accordingly not necessary.

Figure 3:
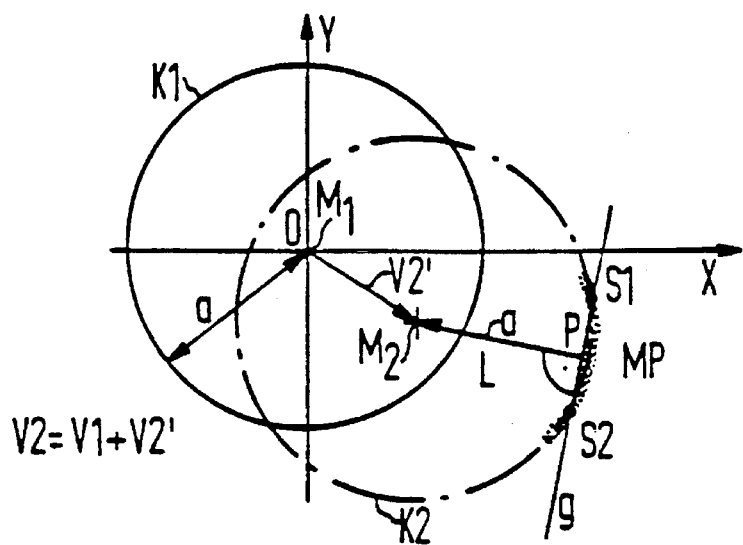
FIG. 3 shows the same for calculation by means of straight line correlation and the normal.

A further process according to the invention (variant 2) is illustrated in FIG. 3, for determining the interference field vector for compensating for the interference field. The process is based on the idea that a circular arc can be approximated by a straight line g within a small angle. If the perpendicular L at the center P is dropped in the direction of the coordinate origin O onto this straight line g or on this straight line section S1, S2 which corresponds to the measurements MP of the earth's magnetic field, and the radius a obtained from the locus curve K1 of the initial compensation is marked off thereon, then this gives the center M2 of the new locus curve K2. The locus curve K1 is the locus curve E1 from the initial compensation, normalized onto the circle, with the center M1 and the radius a. The discontinuously occurring interference field gives a set of measurement points MP on a displaced locus curve E2 to the transformed circle K2.

The new interference field vector is the vector sum of the old interference field vector (V1) and the center displacement OM2. The measurement points MP are statistically matched to a straight line g, and the correlation of this straight line g is determined. The straight line is evaluated with the aid of the correlation; in this case, it has become evident that the empirically found value of 0.93 can be regarded as the lower limit value, in order to avoid an erroneous displacement. In the event of falling below this value, the process is then interrupted and restarted. The points of intersection S1 and S2 of the straight line g with the measurement points MP are calculated, and the center P of the straight line section S1,S2 is determined therefrom. The perpendicular L is then dropped through the center of gravity which has been found P towards the origin O. As already mentioned above, the new center M2 is determined thereon, and the new interference field vector is thus obtained.

In both processes according to the invention, the quality of the interference field vector can be determined on the basis of the comparison of the radius values of all participating magnetic field measurements with the radius derived from the initial compensation. All the original measurements from the magnetic field probe and from the wheel sensor (track pulses) are stored from the moment when the quality of the interference field vector declines. After successful correction of the interference vector, i.e. when the quality of the interference field vector is once again adequately good, the position of the vehicle can subsequently be compensated for on the basis of the stored data.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for compensating for a magnetic interference field in a vehicle, in which, for navigation purposes, a direction of the earth's magnetic field is determined by means of a magnetic field probe and a measuring and evaluating device, and a path distance traveled is determined by a wheel sensor and said direction and said path distance are processed in a navigation computer, said process comprising the following steps:

during a calibration run for initial compensation, determining a first set of interference field parameters from first measurements of the magnetic field probe, which parameters comprise values for an interference field vector, axes of an elliptical locus curve and an oblique position of this locus curve;

transforming the elliptical locus curve into a first circular locus curve having a radius and a center, the center being a coordinate origin;

during travel, taking second measurements with the magnetic field probe and transforming the second measurements into measured value pairs that are points on a second circular locus curve having a radius and a center calculating for each measured value pair, a distance value from the origin and an angle;

defining a segmented memory having memory cells for a range of 0°–360° in which each memory cell corresponds to a predetermined angular region;

averaging the calculated distance values and the circularly transformed measured value pairs and storing the averaged distance values in the memory cells corresponding to their angle;

for each segment, determining a radius difference value from the averaged distance values and the radius of the first circular locus curve;

filtering the radius difference values with a low pass filter;

calculating a maximum value from the filtered radius difference values in terms of direction and magnitude and calculating a new center of the second circular locus curve and calculating a new interference field vector;

calculating further distances from the new circle center to the stored distance values and comparing said further distances with the radius of the first circular locus circle, and, in the event of substantially accurate agreement, carrying out compensation using the new interference field vector.

2. The process as claimed in claim 1, wherein the new interference field vector is calculated only if a minimum number of measurements is exceeded and at the same time a minimum number of angular regions are utilized in the segmented memory.

3. The process as claimed in claim 2, wherein one of a plurality of predetermined combinations of minimum number of measurements and minimum number of utilized angular regions in the segmented memory must be satisfied.

4. The process as claimed in claim 1, wherein a quality of the interference field vector is determined from the comparison of the radius values of all participating magnetic field measurements with the radius of the first circular locus curve obtained from the initial compensation and, in the event of the quality being below a specified value, all original measurements from the magnetic field probe and from the wheel sensor are stored, in order subsequently to correct vehicle position using the new interference field vector and data stored in the segmented memory.

5. A process for compensating for a magnetic interference field in a vehicle, in which, for navigation purposes, a direction of the earth's magnetic field is determined by means of a magnetic field probe and a measuring and evaluating device, and a path distance traveled is determined by a wheel sensor and said direction and said path distance are processed in a navigation computer, said process comprising the following steps:

during a calibration run for initial compensation, determining a first set of interference field parameters from first measurements of the magnetic field probe, which parameters comprise values for an interference field vector, axes of an elliptical locus curve and an oblique position of this locus curve;

transforming the elliptical locus curve into a first circular locus curve having a radius and a center, the center being a coordinate origin;

during travel, taking second measurements with the magnetic field probe and transforming the second measurements into measured value pairs that are points on a second circular locus having a radius and a center;

calculating for each measured value pair, a distance value from the origin and an angle;

defining a segmented memory having memory cells for a range of 0°–360°, in which each memory cell corresponds to a predetermined angular region;

averaging the calculated distance values and the circularly transformed measured value pairs and storing the averaged distance values in the memory cells corresponding to their angle;

calculating a straight line from averaged X and Y values of the measured value pairs using linear regression;

determining a correlation coefficient of this straight line and comparing the correlation coefficient with an empirically found threshold;

if the correlation coefficient is greater than this threshold, determining a center of gravity a straight line section, which is established by the circularly transformed measured value pairs in the segmented memory;

constructing a perpendicular to the straight line at the center of gravity in a direction of the origins;

plotting the radius of the first circular locus curve on the perpendicular, an end point of this plotted radius forming a center of the second circular locus curve, and determining a new interference field vector from a sum of a previous interference field vector and the shift of the center of the second locus curve, and revising the set of interference field parameters with the new interference field vector and using the revised set of interference field parameters in the transformation of measured values.

6. The process as claimed in claim 5, wherein the new interference field vector is calculated only if a minimum number of measurements is exceeded and at the same time a minimum number of angular regions are utilized in the segmented memory.

7. The process as claimed in claim 6, wherein one of a plurality of predetermined combinations of minimum number of measurements and minimum number of utilized angular regions in the segmented memory must be satisfied.

8. The process as claimed in claim 5, wherein a quality of the interference field vector is determined from the comparison of the radius values of all participating magnetic field measurements with the radius of the first circular locus curve obtained from the initial compensation and, in the event of the quality being below a specified value, all original measurements from the magnetic field probe and from the wheel sensor are stored, in order subsequently to correct the vehicle position using the new interference field vector and using data stored in the requested memory, with the utilization of the stored data.

9. A method for compensating for magnetic interference field in a vehicle wherein, for navigation purposes, a direction of the earth's magnetic field is determined with a magnetic field probe and a measuring and evaluating device, and a path distance traveled is determined by a wheel sensor and are processed in a navigation computer, comprising the following method steps:

determining a first set of interference field parameters from first measured values of the magnetic field probe during a calibration drive for an initial compensation, said parameters being composed of values for a first interference field vector, axes of an elliptical locus curve and an oblique attitude of this locus curve;

transforming the elliptical locus curve determined during the calibration drive into a first circular locus curve having a radius and a center that is a coordinate origin;

during travel, taking second measurements with the magnetic field probe and transforming the second measurements into measured value pairs that are points on a second circular locus curve having a radius and a center, taking a set of interference field parameters into account;

calculating a distance value from the origin and an associated angular range for every circularly transformed measured value pair;

defining a segmented memory having memory cells for a range from 0° through 360°, each memory cell corresponding to a predetermined angular range or, respectively, segment;

averaging the calculated distance values and the circularly transformed measured value pairs and storing the averaged distance values in the memory cells corresponding to their angle;

calculating a straight line from average X and Y values of the measured value pairs using a linear regression;

determining a correlation coefficient of the straight line and comparing the correlation coefficient with an empirically found threshold;

if the correlation coefficient is greater than this threshold, determining a center of gravity of a straight line segment that is established by the circularly transformed measured value pairs in the segmented memory;

constructing a perpendicular to the straight line at the center of gravity in a direction of the origin;

entering the circle radius of the first circular locus curve on the perpendicular, an end point thereof forming a center of the second circular locus curve, a new interference field vector being determined from a sum of a previous interference field vector and the shift of the center of the second locus curve, and the new interference field vector being entered into the set of interference field parameters and being taken into account in the transformation of measured values.

10. The method according to claim 9, wherein the second interference field vector is only calculated when a minimum plurality of measured values is exceeded and a minimum plurality of angular ranges is simultaneously utilized in the segment memory.

11. The method according to claim 9, wherein one of a plurality of predetermined combinations of minimum number of measured values and minimum number of utilized angular ranges in the segment memory are satisfied.

12. The method according to claim 9, wherein a quality of an interference field vector is determined from the comparison of the radius values of all magnetic field measured values to the radius of the locus curve from the initial compensation, and, when the quality drops below a specific value, all original measured values from the magnetic field probe and from the wheel sensor are stored in order to subsequently correct vehicle position with the second interference field vector using data stored in the segmented memory.

13. A method for compensating for magnetic interference field in a vehicle wherein, for navigation purposes, a direction of the earth's magnetic field is determined with a magnetic field probe and a measuring and evaluating device, and a path distance traveled is determined by a wheel sensor and are processed in a navigation computer, comprising the following method steps:

determining a first set of interference field parameters from first measured values of the magnetic field probe during a calibration drive for an initial compensation, said parameters being composed of values for a first interference field vector, axes of an elliptical locus curve and an oblique attitude of this locus curve;

transforming the elliptical locus curve determined during the calibration drive into a first circular locus curve having a radius and a center that is a coordinate origin;

during travel, taking second measurements with the magnetic field probe and transforming the second measurements into measured value pairs that are points on a second circular locus curve having a radius and a center, taking a set of interference field parameters into account;

calculating a distance value from the origin and an associated angular range for every circularly transformed measured value pair;

defining a segmented memory having memory cells for a range from 0° through 360°, each memory cell corresponding to a predetermined angular range or, respectively, segment;

averaging the calculated distance values and the circularly transformed measured value pairs and storing the averaged distance values in the memory cells corresponding to their angle;

calculating a straight line from average X and Y values of the measured value pairs using a linear regression;

determining a correlation coefficient of the straight line and comparing the correlation coefficient with an empirically found threshold;

if the correlation coefficient is greater than this threshold, determining a center of gravity of a straight line segment that is established by the circularly transformed measured value pairs in the segmented memory;

constructing a perpendicular to the straight line at the center of gravity in a direction of the origin;

entering the circle radius of the first circular locus curve on the perpendicular, an end point thereof forming a center of the second circular locus curve, a new interference field vector being determined from a sum of a previous interference field vector and the shift of the center of the second locus curve, and the new interference field vector being entered into the set of interference field parameters and being taken into account in the transformation of measured values;

calculating radius difference between the averaged radius values and the radius of the first circular locus curve for each segment;

filtering the radius difference values are filtered with a low-pass filter;

calculating a maximum value in terms of direction and magnitude from the filtered radius difference values and the center of the second circular locus curve and calculating a new interference field vector therefrom;

calculating distances to the stored, circularly transformed measured value pairs proceeding from the center of the second circular locus curve and comparing the calculated distances to the radius of the first circular locus curve, the new interference field vector being inserted into the set of interference field parameters given adequately precise coincidence and being taken into account in the transformation of measured values.

14. The method according to claim 13, wherein the second interference field vector is only calculated when a minimum plurality of measured values is exceeded and a minimum plurality of angular ranges is simultaneously utilized in the segment memory.

15. The method according to claim 13, wherein one of a plurality of predetermined combinations of minimum number of measured values and minimum number of utilized angular ranges in the segment memory are satisfied.

16. The method according to claim 13, wherein a quality of an interference field vector is determined from the comparison of the radius values of all magnetic field measured values to the radius of the locus curve from the initial compensation, and, when the quality drops below a specific value, all original measured values from the magnetic field probe and from the wheel sensor are stored in order to subsequently correct vehicle position with the second interference field vector using data stored in the segmented memory.

* * * * *